(12) United States Patent
Waki et al.

(10) Patent No.: US 10,953,472 B2
(45) Date of Patent: Mar. 23, 2021

(54) ROTARY TOOL

(71) Applicant: KYOCERA CORPORATION, Kyoto (JP)

(72) Inventors: Masahiro Waki, Satsumasendai (JP); Masahiko Kuroda, Higasiomi (JP)

(73) Assignee: KYOCERA Corporation, Kyoto (JP)

( * ) Notice: Subject to any disclaimer, the term of this patent is extended or adjusted under 35 U.S.C. 154(b) by 197 days.

(21) Appl. No.: 16/088,848

(22) PCT Filed: Mar. 27, 2017

(86) PCT No.: PCT/JP2017/012400
§ 371 (c)(1),
(2) Date: Sep. 27, 2018

(87) PCT Pub. No.: WO2017/170406
PCT Pub. Date: Oct. 5, 2017

(65) Prior Publication Data
US 2019/0105716 A1    Apr. 11, 2019

(30) Foreign Application Priority Data

Mar. 28, 2016 (JP) .............................. JP2016-064009
Apr. 25, 2016 (JP) .............................. JP2016-087153

(51) Int. Cl.
*B23B 27/14*  (2006.01)
*B23B 51/02*  (2006.01)
(Continued)

(52) U.S. Cl.
CPC .............. *B23B 27/14* (2013.01); *B23B 51/00* (2013.01); *B23B 51/02* (2013.01); *B23C 5/16* (2013.01);
(Continued)

(58) Field of Classification Search
CPC ................................ B23B 27/14; B23B 51/02
(Continued)

(56) References Cited

U.S. PATENT DOCUMENTS

| | | | |
|---|---|---|---|
| 2003/0148144 A1* | 8/2003 | Gates, Jr. .............. | C23C 30/005 |
| | | | 428/698 |
| 2011/0188956 A1* | 8/2011 | Mueller ................. | B23P 15/32 |
| | | | 408/230 |
| 2015/0343535 A1 | 12/2015 | Sakamoto | |

FOREIGN PATENT DOCUMENTS

| | | | |
|---|---|---|---|
| JP | 2003048107 A | 2/2003 | |
| JP | 2003170303 A | 6/2003 | |

(Continued)

*Primary Examiner* — Archene A Turner
(74) *Attorney, Agent, or Firm* — Viering, Jentschura & Partner mbB

(57) ABSTRACT

A rotary tool may include a main body having a bar-shape. The main body may include a cutting edge part at a first end, and a shank part at a second end. The cutting edge part may include a base member including a plurality of ridges, and a coating layer located on at least the ridges. The coating layer may include a layer containing $Si_xM_{1-x}(C_{1-y}N_y)$ (where M is at least one kind selected from Ti, Al, Cr, W, Mo, Ta, Hf, Nb, Zr, and Y, $0.01 \leq x \leq 0.55$, and $0 \leq y \leq 1$). A first region of the coating layer is closer to the first end than a second region of the coating layer, which is further away from the first end than the first region, and a content ratio of Si in the first region is lower than a content ratio of Si in the second region.

8 Claims, 7 Drawing Sheets

(51) Int. Cl.
*B23C 5/16* (2006.01)
*C23C 14/06* (2006.01)
*B23B 51/00* (2006.01)

(52) U.S. Cl.
CPC .......... *C23C 14/06* (2013.01); *C23C 14/0641* (2013.01); *B23B 2228/10* (2013.01); *B23C 2228/10* (2013.01)

(58) Field of Classification Search
USPC ......... 480/230; 428/212, 325, 697, 698, 699
See application file for complete search history.

(56) References Cited

FOREIGN PATENT DOCUMENTS

| | | | |
|---|---|---|---|
| JP | 2004-074361 | * | 3/2004 |
| JP | 2005297145 | A | 10/2005 |
| JP | 2006-082206 | * | 3/2006 |
| WO | 2014104111 | A1 | 7/2014 |

* cited by examiner

ROTARY TOOL

CROSS-REFERENCE TO RELATED APPLICATIONS

This application is a national stage entry according to 35 U.S.C. 371 of PCT Application No. PCT/JP2017/012400 filed on Mar. 27, 2017, which claims priority to Japanese Application No. 2016-064009 filed on Mar. 28, 2016, and Japanese Application No. 2016-087153 filed on Apr. 25, 2016, which are entirely incorporated herein by reference.

TECHNICAL FIELD

The present disclosure relates to a rotary tool including a coating layer deposited on a surface of a base member.

BACKGROUND

As an example of rotary tools, such as drills, end mills, and reamers, a rotary tool has been known which has an elongated shape including a rotation axis and includes a base member and a coating layer that coats a surface of the base member. For example, Japanese Unexamined Patent Publication No. 2003-48107 (Patent Document 1) and Japanese Unexamined Patent Publication No. 2003-170303 (Patent Document 2) respectively discuss TiAlSiN layers as a coating layer.

When a cutting process is carried out using a rotary tool, the rotary tool needs high durability and high machining accuracy.

SUMMARY

A rotary tool in a non-limiting aspect of the disclosure includes a main body having a bar-shape extending from a first end to a second end. The main body includes a cutting edge part at a side of the first end and a shank part at a side of the second end. The cutting edge part includes a base member including a plurality of ridges, and a coating layer located on at least the ridges. The coating layer includes a layer containing $Si_xM_{1-x}C_{1-y}N_y$ (where M is at least one kind selected from Ti, Al, Cr, W, Mo, Ta, Hf, Nb, Zr, and Y, $0.01 \leq x \leq 0.55$, and $0 \leq y \leq 1$). When a region close to the first end is referred to as a first region and a region further away from the first end than the first region is referred to as a second region in the coating layer, a content ratio of Si contained in the first region is lower than a content ratio of Si contained in the second region.

DETAILED DESCRIPTION

Figure 1:
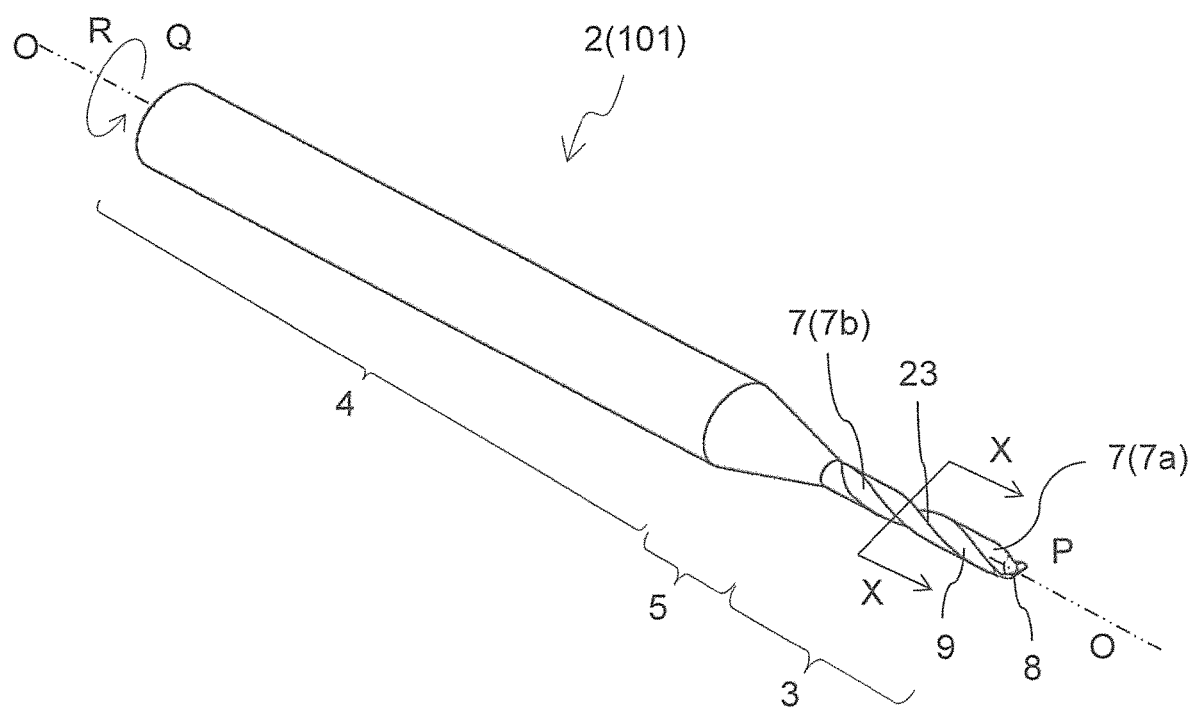
FIG. 1 is a perspective view illustrating a drill that is a rotary tool according to a non-limiting aspect of the disclosure.

Rotary tools in a plurality of aspects of the disclosure are described in detail below with reference to the drawings. For the sake of description, the drawings referred to in the following illustrate, in a simplified form, main members of members constituting various aspects of the disclosure. The rotary tools are therefore capable of including any arbitrary structural member not illustrated in the drawings referred to. Sizes of the members in each of the drawings do not faithfully represent sizes and size ratios of actual structural members.

Firstly, the rotary tool 101 in a non-limiting aspect of the disclosure is described. Although examples of the rotary tool include drills, end mills and reamers, FIGS. 1 to 3 illustrate the drill 101 as a rotary tool.

Figure 2:
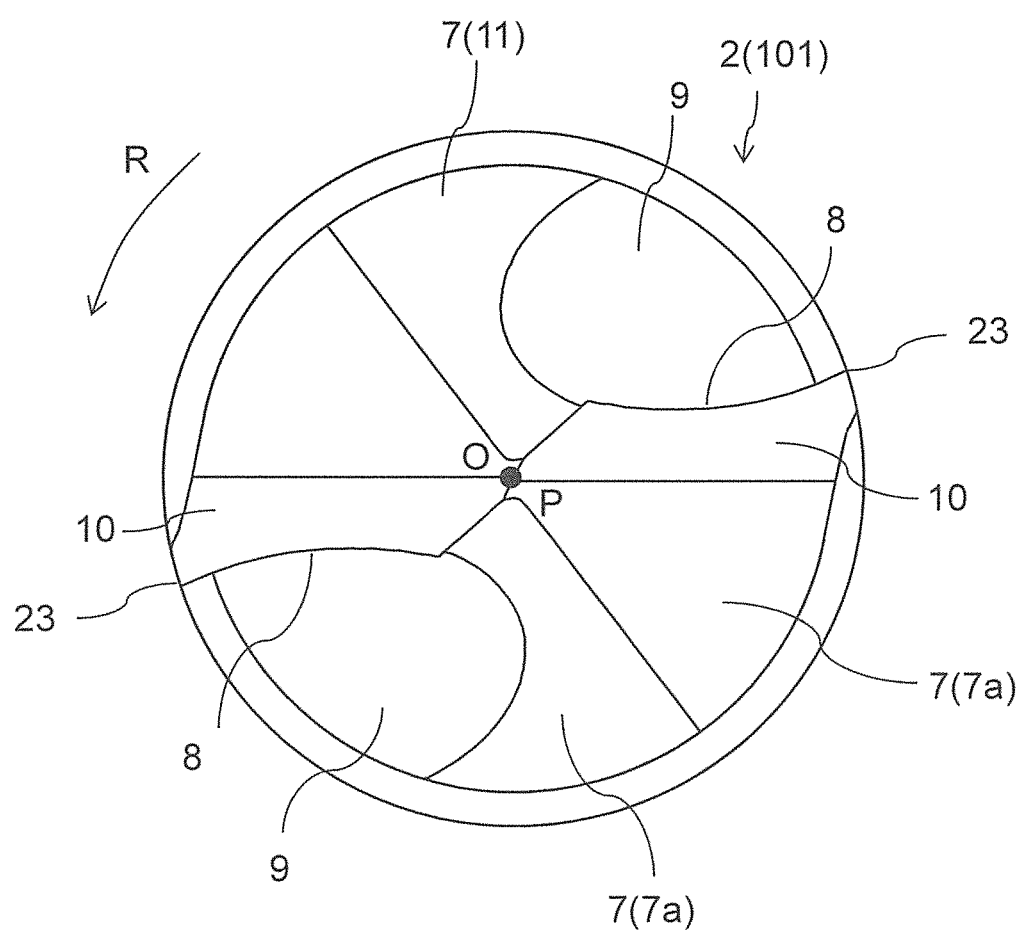
FIG. 2 is a front view illustrating only a cutting edge part in the drill in FIG. 1.

The drill 101 illustrated in FIG. 1 is a solid-type drill and includes a main body 2. The main body 2 has a bar shape extending from a first end P to a second end Q, and is rotatable around a rotation axis O. The first end P is such a part that first comes into contact with a workpiece during a cutting process. The second end Q is a farthermost part from the first end P in a longitudinal direction. In general, the first end P is referred to as a front end, and the second end Q is referred to as a rear end of the drill.

The main body 2 illustrated in FIG. 1 includes a cutting edge part 3 (flute part) located at a side of the first end P, and a shank part 4 located at a side of the second end Q. The first end P is located at the cutting edge part 3, and the second end Q is located at the shank part 4 in the present non-limiting aspect of the disclosure. Alternatively, the cutting edge part 3 and the shank part 4 may be formed separately or integrally. The present non-limiting aspect of the disclosure illustrate that the main body 2 further includes, besides the cutting edge part 3 and the shank part 4, a tapered part 5 located between the cutting edge part 3 and the shank part 4.

Figure 3:
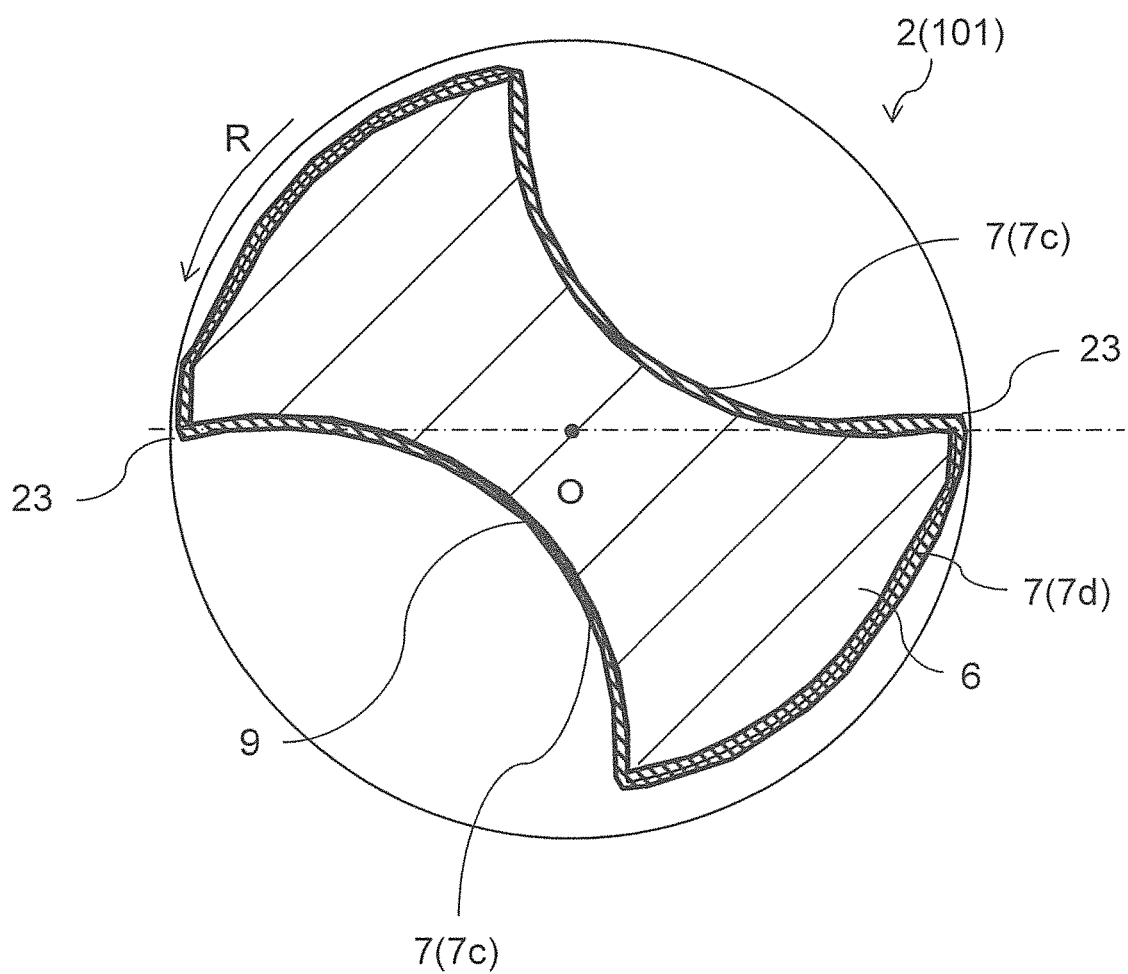
FIG. 3 is a sectional view taken along line X-X in FIG. 1.

The cutting edge part 3 includes a base member 6 having a plurality of ridges, and a coating layer 7 that coats these ridges as illustrated in FIG. 3. The cutting edge part 3 in the present non-limiting aspect of the disclosure further includes a cutting edge 8 located at a side of the first end P, and a chip discharge flute (hereinafter referred to simply as "flute") 9 which extends from a side of the first end P to a side of the second end Q in between the ridges and is located on the coating layer 7.

The cutting edge part 3 includes two cutting edges 8 and flank surfaces 10 respectively adjacent to these cutting edges 8 in a front view when the cutting edge part 3 is viewed toward the first end P as illustrated in FIG. 2. The flute 9 is adjacent to the cutting edges 8 and located on an opposite side of the flank surfaces 10 with the cutting edges 8 interposed therebetween. In other words, the cutting edges 8 are located along at least a part of an intersection ridge line of the flute 9 and the flank surfaces 10 in the present non-limiting aspect of the disclosure. Letter R illustrated in FIG. 2 indicates a rotation direction of the drill 101. The rotation axis O is overlapped with the first end P in FIG. 2.

FIG. 3 illustrates a sectional view taken along line X-X in FIG. 1. The cutting edge part 3 includes the base member 6 and the coating layer 7 that coats the surface of the base member 6 as illustrated in FIG. 3. The base member 6 is composed of a hard material, such as cemented carbide, cermet, cBN, or high-speed steel. Although the cutting edge part 3 includes the coating layer 7 that coats the base member 6 in the present non-limiting aspect of the disclosure, a surface of the shank part 4 may or may not be coated with the coating layer 7.

The coating layer 7 in the present non-limiting aspect of the disclosure includes a layer containing $Si_xM_{1-x}(C_{1-y}N_y)$ (where M is at least one kind selected from Ti, Al, Cr, W, Mo, Ta, Hf, Nb, Zr, and Y, $0.01 \le x \le 0.55$, and $0 \le y \le 1$). The coating layer 7 has excellent hardness and wear resistance by containing, as M, at least one kind selected from Ti, Al, Cr, W, Mo, and Nb. When M contains at least one kind selected from Ti, Al, Mo, and Nb, the coating layer 7 has excellent resistance to oxidation at high temperatures, and for example, crater wear is less likely to develop during high-speed cutting.

A more specific composition of the coating layer 7 is $Si_xTi_bAl_cNb_dW_e(C_{1-y}N_y)$ ($0.01 \le x \le 0.55$, $0.13 \le b \le 0.8$, $0 \le c \le 0.65$, $0 \le d \le 0.25$, $0 \le e \le 0.3$, $a+b+c+c+d+e=1$, and $0 \le y \le 1$). Here, the coating layer 7 may contain a tiny amount, specifically, less than 1% by atom of at least one kind selected from Cr, Mo, Ta, Hf, Zr, and Y.

When the coating layer 7 has the composition as exemplified above, an oxidation initiation temperature in the coating layer 7 is increased, thus leading to enhanced oxidation resistance of the coating layer 7. Fracture resistance of the coating layer 7 is also enhanced because an internal stress existing therein falls within an appropriate range.

When the coating layer 7 has the composition as exemplified above, the coating layer 7 has high hardness, thus leading to enhanced adhesion to the base member 6. This ensures the excellent wear resistance and fracture resistance of the coating layer 7 even under severe cutting conditions, such as machining of difficult-to-machine material, dry cutting, and high-speed cutting.

When the coating layer 7 has the composition as illustrated above, the coating layer 7 has high wear resistance because hardness is less likely to degrade due to a crystal structure change from cubical crystal to hexagonal crystal in the coating layer 7 when "b" (Ti content ratio) is 0.13 or more. The coating layer 7 has enhanced oxidation resistance and heat resistance when "b" (Ti content ratio) is 0.8 or less. A range of "b" may be $0.2 \le b \le 0.5$ in a non-limiting aspect of the disclosure.

When the coating layer 7 has the composition as exemplified above, the coating layer 7 has high wear resistance because hardness is less likely to degrade due to a crystal structure change from cubical crystal to hexagonal crystal in the coating layer 7 when "c" (an Al composition ratio) is 0.65 or less. A range of "c" may be $0.45 \le c \le 0.65$ in a non-limiting aspect of the disclosure, or may be $0.5 \le c \le 0.63$ in another non-limiting aspect of the disclosure.

When the coating layer 7 has the composition as exemplified above, the coating layer 7 has high wear resistance because the oxidation resistance and hardness of the coating layer 7 are less likely to degrade when "d" (Nb content ratio) is 0.25 or less. A range of "d" may be $0.02 \le d \le 10.22$ in a non-limiting aspect of the disclosure.

When the coating layer 7 has the composition as exemplified above, the coating layer 7 has high wear resistance because the oxidation resistance and hardness of the coating layer 7 are less likely to degrade when "e" (W content ratio) is 0.3 or less. A range of "e" may be $0.02 \le e \le 0.22$ in a non-limiting aspect of the disclosure.

From the viewpoints of hardness and toughness necessary for the rotary tool, non-metal ingredients C and N of ingredients contained in the coating layer 7 have "y" (N content ratio), which is $0 \le y \le 1$, particularly $0.8 \le y \le 1$. With the present non-limiting aspect of the disclosure, the composition of the coating layer 7 is measurable by Energy Dispersive X-ray Spectroscopic analysis method (EDX) or X-ray Photoelectron Spectroscopic analysis method (XPS).

Although a thickness tf of the coating layer 7 in the flank surface 10 is not limited to a specific value, the thickness tf is settable to, for example, 0.5-3 μm. When tf has this value, a tool life can be elongated by keeping a balance between the wear resistance in the cutting edge 8 and stiffness improvement of the drill 101.

The coating layer 7 may not necessarily be composed only of the layer having the above-mentioned composition, but may have a structure formed by laminating another layer made of a composition different from that of the layer having the above-mentioned composition. In cases where the coating layer 7 is composed of a plurality of layers, a part of the layers may not contain Si. Alternatively, Si content ratios may be different from each other. Still alternatively, the coating layer 7 may have a structure formed by alternately laminated two layers whose compositions are different from each other.

The coating layer 7 having a multilayer structure of two or more kinds of layers whose compositions are different from each other can be manufactured, for example, by carrying out deposition while rotating a sample subjected to the deposition in a state in which targets whose compositions are different from each other are disposed at a predetermined interval on an internal wall side surface of a chamber of a deposition apparatus. In the present non-limiting aspect of the disclosure, a composition of the coating layer 7 is one which is obtained by analyzing an overall composition of the coating layer 7 from the surface of the coating layer 7 by the following method.

Specifically, when a measurement surface is, for example, the flank surface 10 adjacent to the cutting edge 8, a surface on the flank surface 10 is measured by an Electron Probe Micro Analyzer (EPMA), and an obtained composition is regarded as the composition of the coating layer 7. Even when the coating layer 7 has the multilayer structure, a composition obtained from surface measurement by the EPMA is regarded as the composition of the coating layer 7.

When a region close to the first end P is referred to as a first region 7a and a region further away from the first end P than the first region 7a is referred to as a second region 7b in the coating layer 7 in the drill 101 of a non-limiting aspect of the disclosure, a content ratio of Si contained in the first region 7a is different from a content ratio of Si contained in the second region 7b. Specifically, the content ratio of Si contained in the first region 7a is lower than the content ratio of Si contained in the second region 7b.

Durability of the drill 101 can be enhanced and machining accuracy during a cutting process can also be enhanced because the content ratio of Si contained in the first region 7a is lower than the content ratio of Si contained in the second region 7b in the drill 101 of a non-limiting aspect of the disclosure.

Specifically, fracture resistance of the cutting edge located at a side of the first end P can be enhanced because the coating layer 7 is less likely to separate in the vicinity of the rotation axis O in each of the case of machining a workpiece in which materials being different in hardness coexist, such as carbon fiber and resin in a CFRP material being prone to fracture, the case of machining a workpiece, such as a laminate material obtained by laminating a plurality of materials being different in hardness, and the case of machining by cutting during which intermittent impact is exerted, such as a shouldering process.

The content ratio of Si contained in the second region 7b is high. Stiffness of the base member 6 becomes improved because compressive stress is applicable by the second region 7b to the base member 6 at a side of the second end Q in the cutting edge part 3. Because the stiffness of the base member 6 becomes improved, the drill 101 is less likely to oscillate during a cutting process, thus leading to improved machining accuracy.

The stiffness of the base member 6 becomes more appropriate and the machining accuracy of the drill 101 becomes more improved when the content ratio of Si contained in the coating layer 7 is designed to gradually increase from a side of the first end P to a side of the second end Q. The term "gradually increase" denotes that when the content ratio of Si is measured at each of five points set at equal intervals, including an end portion at a side of the first end P and an end portion at a side of the second end Q in the coating layer 7, the content ratio of Si increases monotonously from the end portion at the side of the first end P to the end portion at the side of the second end Q.

When the coating layer 7 contains Ti and a content ratio of Ti contained in the first region 7a is higher than a content ratio of Ti contained in the second region 7b, the durability of the drill 101 can be further enhanced and the machining accuracy during the cutting process can be further enhanced.

When the coating layer 7 contains Al and a content ratio of Al contained in the first region 7a is higher than a content ratio of Al contained in the second region 7b, the durability of the drill 101 can be further enhanced and the machining accuracy during the cutting process can be further enhanced.

When the coating layer 7 contains Nb and a content ratio of Nb contained in the first region 7a is lower than a content ratio of Nb contained in the second region 7b, the durability of the drill 101 can be further enhanced and the machining accuracy during the cutting process can be further enhanced.

Particulate matter called a plurality of droplets, which is different from the coating layer 7 in composition, may exist in a surface of the first region 7a and a surface of the second region 7b in the cutting edge part 3. When an abundance ratio of the droplets in the first region 7a is lower than an abundance ratio of the droplets in the second region 7b, the cutting edge 8 is less prone to welding, and it is possible to increase an amount of cutting fluid retainable by the cutting edge part 3 during machining using the cutting fluid.

The phrase that the abundance ratio of the droplets in the first region 7a is lower than the abundance ratio of the droplets in the second region 7b can be rephrased that a density of the droplets in the first region 7a is lower than a density of the droplets in the second region 7b.

Also, when the droplets in the second region 7b have a greater size than the droplets in the first region 7a, the cutting edge 8 is less prone to welding, and it is possible to increase the amount of cutting fluid retainable by the cutting edge part 3 during machining using the cutting fluid.

When the abundance ratio of the droplets decreases from the second end Q toward the first end P, specifically, when the abundance ratio of the droplets decreases monotonously at three or more regions in a direction from the second end Q toward the first end P, the cutting edge 8 is much less prone to welding.

The abundance ratio of droplets is obtainable by identifying the droplets from an SEM photograph of the surface of the coating layer 7, and by counting the number of the droplets in a region of, for example, 10 μm×10 μm. Here, particles having a diameter of 0.2 μm or more are identified as a droplet. A photographing point of the SEM photograph is common to both a side of the first end P and a side of the second end Q, by setting to, for example, an outer peripheral portion of the flute 9.

When a content ratio of M in the droplets is higher than a content ratio of M in the coating layer 7, a content ratio of Si in the droplets can be made relatively low, and therefore, the cutting edge 8 is much less prone to welding.

Here, the coating layer 7 located at the flute 9 is referred to as a third region 7c, and the coating layer 7 located at an outer peripheral surface in the cutting edge part 3 is referred to as a fourth region 7d. When a content ratio of Si in at least a part of the third region 7c is lower than a content ratio of Si contained in the fourth region 7d, heat resistance in an outer peripheral cutting edge 23 can be enhanced, and slidability in the flute 9 can be enhanced. The content ratio of Si contained in the third region 7c and that in the fourth region 7d need to be respectively measured at the same position in a direction along the rotation axis O in the cutting edge part 3.

The heat resistance in the outer peripheral cutting edge 23 can be further enhanced and the slidability in the flute 9 can be further enhanced when the coating layer 7 contains Ti and a content ratio of Ti in at least a part of the third region 7c is higher than a content ratio of Ti contained in the fourth region 7d. Similarly to the content ratio of Si, the content ratio of Ti contained in each of the third region 7c and the fourth region 7d needs to be measured at the same position in the direction along the rotation axis O in the cutting edge part 3.

The heat resistance in the outer peripheral cutting edge 23 can be further enhanced and the slidability in the flute 9 can be further enhanced when the coating layer 7 contains Al and a content ratio of Al in at least a part of the third region 7c is higher than a content ratio of Al contained in the fourth region 7d. Similarly to the content ratio of Si, the content ratio of Al contained in each of the third region 7c and the fourth region 7d needs to be measured at the same position in the direction along the rotation axis O in the cutting edge part 3.

Examples of material constituting the base member 6 include metal, cemented carbide, cermet, and ceramics. Examples of the metal include stainless steel and titanium. Examples of composition of the cemented carbide include WC (tungsten carbide)-Co (cobalt), WC—TiC (titanium carbide)-Co, WC—TiC—TaC (tantalum carbide)-Co, and WC—TiC—TaC—$Cr_3C_2$ (chromium carbide)-Co. Here, WC, TiC, Tac, and $Cr_3C_2$ are hard particles, and Co is a binding phase.

The cermet is a sintered composite material obtained by compositing metal into a ceramic ingredient. A specific example of the cermet is one which is composed mainly of a titanium compound, such as TiC and TiN (titanium nitride). Examples of the ceramics include $Al_2O_3$ (aluminum oxide), $Si_3N_4$ (silicon nitride), and cBN (Cubic Boron Nitride).

Figure 4:
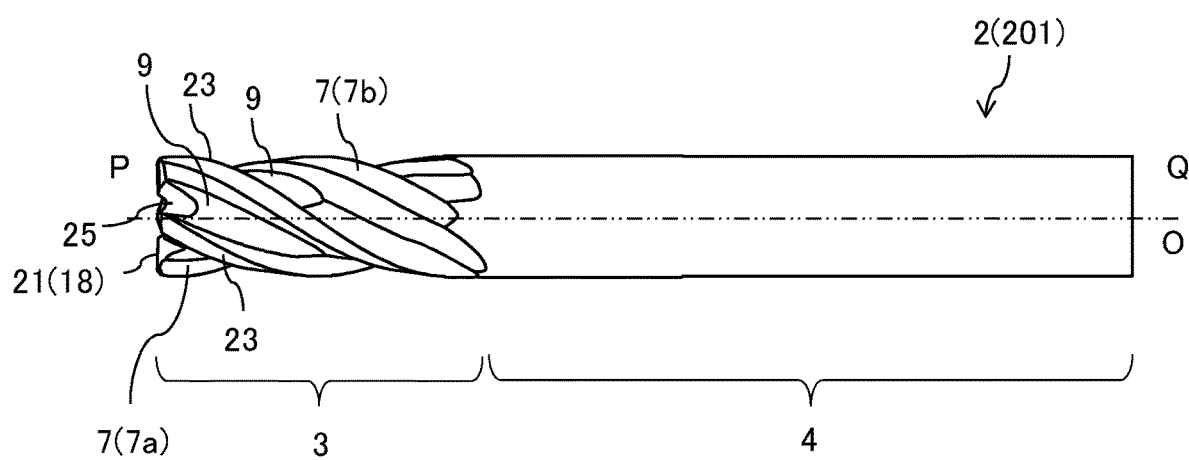
FIG. 4 is a side view illustrating an end mill that is a rotary tool according to a non-limiting aspect of the disclosure.
Figure 5:
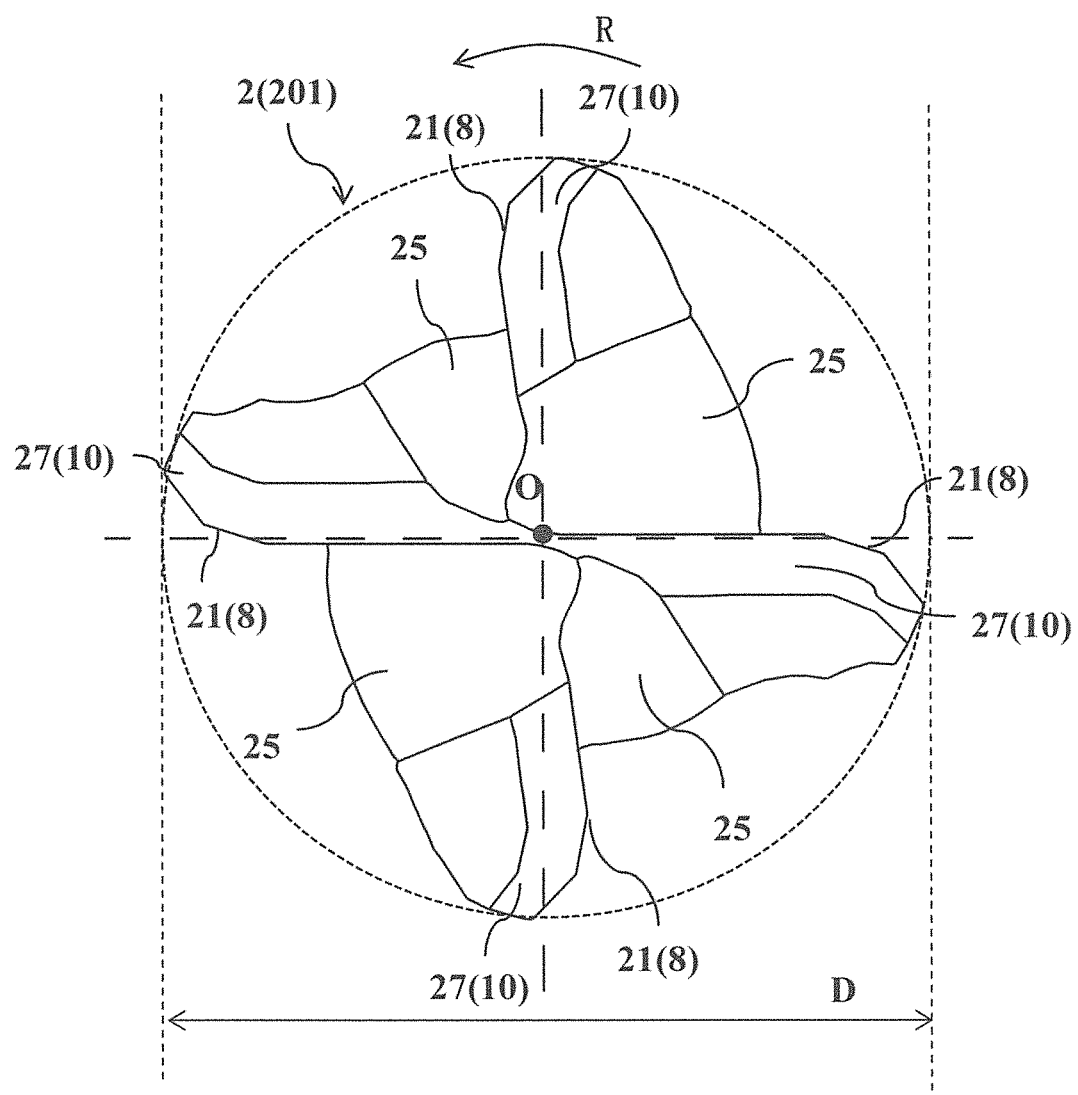
FIG. 5 is a front view of the end mill in FIG. 4.

A rotary tool 201 in another non-limiting aspect of the disclosure is described below. The rotary tool in the present non-limiting aspect of the disclosure is the end mill 201 as illustrated in FIGS. 4 and 5 even though drill 101 is also illustrated as a rotary tool. Components of the end mill 201 in the present non-limiting aspect of the disclosure, which are similar to those of the drill 101, bear the same reference numerals in FIGS. 4 and 5, and their descriptions are omitted here.

The end mill 201 in FIG. 4 is a solid-type end mill, and includes a main body 2 that is rotatable around a rotation axis O. A main body 2 illustrated in FIG. 4 includes a cutting edge part 3 and a shank part 4 as in the case of the drill 101, but does not include a configuration corresponding to the tapered part 5 of drill 101.

The cutting edge part 3 includes a base member 6, a coating layer 7, and an end cutting edge 21 located at a side of a first end P. The cutting edge part 3 in the present non-limiting aspect of the disclosure includes an outer peripheral cutting edge 23, a chip discharge flute (flute) 9, and a gash 25. The outer peripheral cutting edge 23 is located along an outer peripheral surface of the cutting edge part 3 and extends from a side of the first end P toward a side of a second end Q. The flute 9 extends along the outer peripheral cutting edge 23 and extends from a side of the first end P toward a side of the second end Q. The gash 25 extends along the end cutting edge 21 at a side of the first end P, and is located between the end cutting edge 21 and the flute 9. The outer peripheral cutting edge 23 may connect to the end cutting edge 21 at a side of the first end P. In this case, the flute 9 may be in contact with the end cutting edge 21 at the side of the first end P.

A plurality of ridges function as the outer peripheral cutting edge 23 in the present non-limiting aspect of the disclosure. In other words, the flute 9 is directed from a side of the first end P toward a side of the second end Q in between the outer peripheral cutting edges 23, and is located on the coating layer 7.

With reference to a front view of the end mill 201 illustrated in FIG. 5 (a diagram viewed toward the first end P), a part of the flute 9 is located on a forward side in a rotation direction of the end mill 201 with respect to each of the end cutting edges 21 in the end mill 201. An end flank surface 27 is adjacent to each of the end cutting edges 21 on a backward side in the rotation direction. Letter "D" in FIG. 5 denotes a diameter of a circle drawn when an outer peripheral end of each of the end cutting edges 21 rotates, specifically, a milling diameter of the end mill 201.

Similarly to the drill 101, the coating layer 7 of the end mill 201 in the present non-limiting aspect of the disclosure includes a layer containing $Si_xM_{1-x}(C_{1-y}N_y)$ (where M is at least one kind selected from Ti, Al, Cr, W, Mo, Ta, Hf, Nb, Zr, and Y, $0.01 \leq x \leq 0.55$, and $0 \leq y \leq 1$).

Here, a content ratio of Si contained in the first region 7a is different from a content ratio of Si contained in the second region 7b. Specifically, the content ratio of Si contained in the first region 7a is lower than the content ratio of Si contained in the second region 7b.

The end mill 201 in a non-limiting aspect of the disclosure is usable for a cutting process during which great impact is exerted on the end cutting edges 21. Similarly to drill 101, the coating layer 7 is less likely to separate because the content ratio of Si contained in the coating layer 7 is designed as described above in the end mill 201 used for this purpose. It is consequently possible to enhance durability of the end mill 201 and enhance machining accuracy during the cutting process. Boundary wear that occurs at a terminal end, at which the outer peripheral cutting edge 23 comes into contact with a workpiece, is less likely to develop during end surface machining in the end mill 201.

Similarly to the drill 101, the cutting edge part 3 in the present non-limiting aspect of the disclosure may contain a plurality of droplets. When an abundance ratio of the droplets in the first region 7a is lower than an abundance ratio of the droplets in the second region 7b, the end cutting edges 21 are less prone to chip welding, and it is possible to increase an amount of cutting fluid retainable by the cutting edge part 3 during machining using the cutting fluid.

(Manufacturing Method)

A method of manufacturing a rotary tool in a non-limiting aspect of the disclosure is described below. The present non-limiting aspect of the disclosure employ the end mill 201 illustrated in the present non-limiting aspect of the disclosure as a rotatory tool.

Firstly, a base member 6 is obtained by preparing a columnar body composed of metal, cemented carbide, cermet, or ceramics, and by making the columnar body into a desired shape by using a processing machine. A coating layer 7 is then deposited on a surface of the base member 6. A Physical Vapor Deposition (PVD) method, such as ion plating method and sputtering method, is suitably applicable as a deposition method for the coating layer 7.

Figure 6:
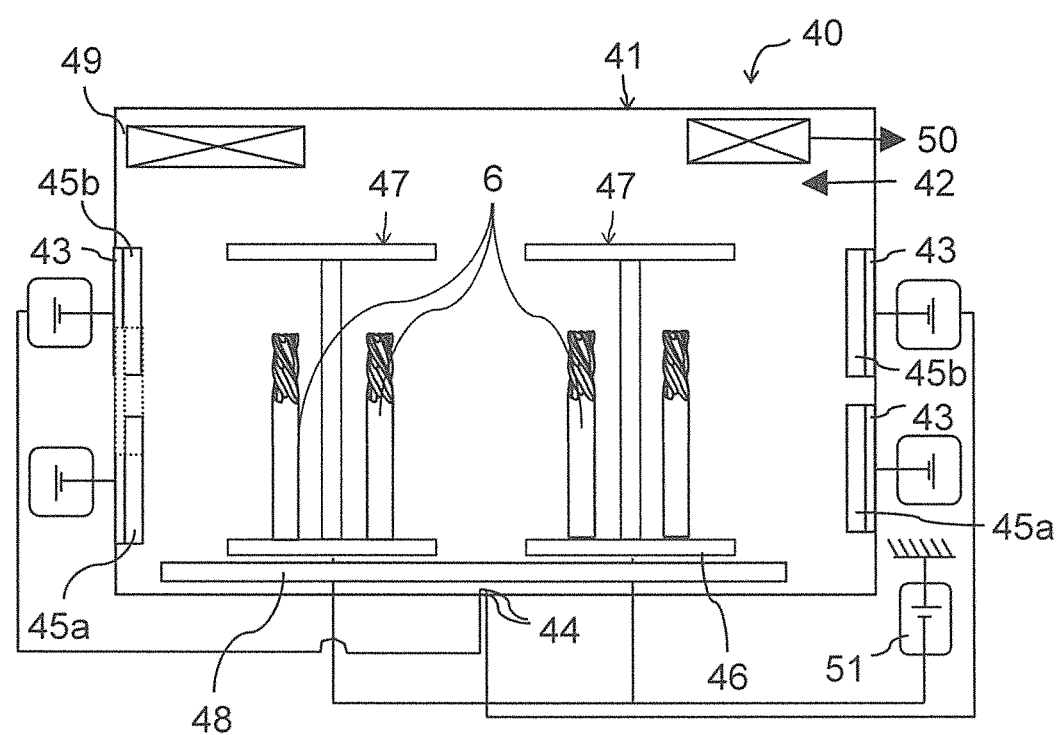
FIG. 6 is a schematic diagram for setting methods when depositing a coating layer on a surface of a base member in a non-limiting aspect of the disclosure.

A deposition method using an Arc Ion Plating deposition apparatus (hereinafter referred to simply as an AIP apparatus 40) illustrated in FIG. 6 is described below as an a non-limiting aspect of the disclosure of the deposition methods.

An arrangement for the base member 6 is made firstly, and gas, such as $N_2$ and Ar, is introduced through a gas inlet 42 into a vacuum chamber (hereinafter referred to simply as a chamber) 41. Subsequently, plasma is generated by applying a high voltage between a cathode electrode 43 and an anode electrode 44 which are arranged in the chamber 41.

A high energy state is obtained by evaporating and ionizing desired metal or ceramics from main targets 45 (45a and 45b) by the plasma. The coating layer 7 can be coated on a surface of a sample (the base member 6) by causing the ionized metal to adhere to the surface of the base member 6.

With reference to FIG. 6, a tower 47 is made by setting the base member 6 on a sample support base 46, and a plurality of towers 47 are designed to be mounted on a table 48. With further reference to FIG. 6, a heater 49 for heating the base member 6, a gas exhaust port 50 for exhausting gas to the outside of a system, and a bias power source 51 for applying a bias voltage to the base member 6 are arranged in the chamber 41. The base member 6 in FIG. 6 is a base member in the shape of the end mill 201 as illustrated in FIGS. 4 and 5.

At least two targets (45a and 45b) being different in Si content ratio are set on a sidewall surface of the chamber 41. Here, the first target 45a having a high Si content ratio is set on a lower side of the sidewall surface of the chamber 41, and the second target 45b containing no Si or having a low Si content ratio is set on an upper side of the sidewall surface of the chamber 41.

The first target 45a contains metal silicon (Si) and a predetermined metal M (where M is at least one kind selected from Ti, Al, Cr, W, Mo, Ta, Hf, Nb, Zr, and Y). The second target 45b contains a predetermined metal M (where M is at least one kind selected from Ti, Al, Cr, W, Mo, Ta, Hf, Nb, Zr, and Y), and contains no metal silicon (Si) or has a lower content ratio of the metal silicon than the first target 45a.

With the present non-limiting aspect of the disclosure, when setting the base member 6 in the chamber, the base member 6 is set so that a first end P is directed upward and a second end Q is directed downward as illustrated in FIG. 6. Subsequently, the second target 45b is mounted on a relatively upper side and the first target 45a is mounted on a relatively lower side on the sidewall surface of the chamber 41. This makes it possible to change a ratio of each metal in the coating layer 7 deposited on the surface of the base member 6 and also change an existing state of droplets.

In the present non-limiting aspect of the disclosure, the first target 45a may be set on a relatively upper side on the sidewall surface of the chamber 41, and the second target 45b may be set on a relatively lower side on the sidewall surface of the chamber 41. Additionally, setting may be made so that the first end P of the base member 6 is directed downward and the second end Q thereof is directed upward.

Also, when the drill 101 illustrated in a non-limiting aspect of the disclosure is employed as a rotary tool, the first target 45a and the second target 45b need to have the above positional relationship. However, when the drill 101 illustrated in the further non-limiting aspect of the disclosure is employed as a rotary tool, the first target 45a needs to be set on a relatively lower side on the sidewall surface of the chamber 41, and the second target 45b needs to be set on a relatively upper side on the sidewall surface of the chamber 41. Additionally, setting needs to be made so that the first end P of the base member 6 is directed upward and the second end Q thereof is directed downward.

Figure 7:
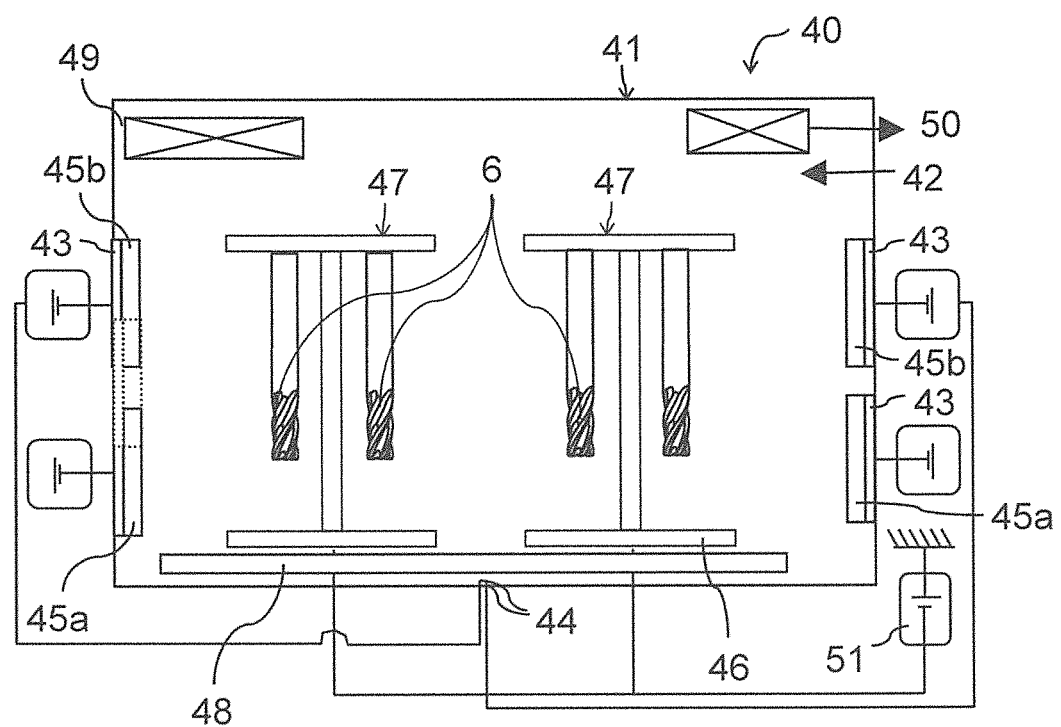
FIG. 7 is a schematic diagram for setting methods when depositing a coating layer on a surface of a base member in a non-limiting aspect of the disclosure.

When manufacturing an end mill in which a content ratio of Si contained in the first region 7a is higher than a content ratio of Si contained in the second region 7b, the base member 6, the first target 45a, and the second target 45b need to be set, for example, as illustrated in FIG. 7, as in the case of the drill 101 illustrated in the further non-limiting aspect of the disclosure.

The coating layer 7 is deposited by ion plating method or sputtering method in which a metal source is reacted with nitrogen gas ($N_2$) of a nitrogen source and/or methane ($CH_4$)/acetylene ($C_2H_2$) gas of a carbon source at the same time that the above targets are used and a metal source is vaporized and ionized, for example, by an arc discharge and a glow discharge. A bias voltage of 35-300 V needs to be applied during deposition of the coating layer 7 in order to enhance hardness of the coating layer 7 and also enhance adhesion to the base member 6.

Example 1

A base member composed of cemented carbide was manufactured as follows. An amount of 10% by mass of metallic cobalt (Co) powder having a mean particle diameter of 1.2 µm, an amount of 0.1% by mass of vanadium carbide (VC) powder having a mean particle diameter of 1 µm, and an amount of 0.3% by mass of chromium carbide ($Cr_3C_2$) powder having a mean particle diameter of 1 µm were added to a main ingredient that was tungsten carbide (WC) powder having a mean particle diameter of 0.8 µm. These were mixed together, followed by molding and sintering. The base member was made into the shape of the end mill illustrated in FIGS. 4 and 5 by subjecting the base member to a sharpening process.

The base member so manufactured and targets presented in Table 1 were individually set to a chamber. Here, the base member was set to the chamber so that a first end was directed upward and a second end was directed downward. Each of coating layers respectively having compositions presented in Tables 2 and 3 was deposited by setting a deposition temperature to 540° C., by respectively applying bias voltages presented in Table 1, and by passing an arc current 150 A.

Arbitrary three points at each of positions in each of obtained samples, and droplets formed on a surface at each of these positions were observed from a surface of the coating layer by a Scanning Electron Microscope (SEM), and a composition at each of the positions was analyzed. The above-mentioned positions were as follows: an end flank surface of an end cutting edge (indicated as a first end side in Tables); an outer peripheral surface at a position 20 mm behind the end cutting edge (indicated as a second end side in Tables); an outer peripheral surface at a position 10 mm behind the end cutting edge (indicated as a second region in Tables); and a flute bottom at a position 10 mm behind the end cutting edge (indicated as a first region in Tables). An average composition at the three points was presented as a composition of the coating layer. The number of droplets having a diameter of 0.2 µm or more in an arbitrary region of 10 µm×10 µm in a field of view was measured, and an average number in five measurement portions was calculated. The results were presented in Tables 1 and 2.

A cross section including the coating layer in each of the samples was subjected to an SEM observation, and a cross section vertical to the rotation axis O was taken at a position 10 mm behind the end cutting edge. A thickness of the coating layer in the fourth region was measured as 2 µm.

TABLE 1

| Sample No. | First target | Second target | Bias voltage (V) | First region | Second region |
|---|---|---|---|---|---|
| I-1 | AlTiNbSi | AlTiNb | 75 | $Si_{0.01}Ti_{0.33}Al_{0.56}Nb_{0.1}N$ | $Si_{0.03}Ti_{0.22}Al_{0.6}Nb_{0.15}N$ |
| I-2 | TiAlSiNb | TiAlNb | 75 | $Si_{0.06}Ti_{0.29}Al_{0.61}Nb_{0.04}N$ | $Si_{0.08}Ti_{0.25}Al_{0.63}Nb_{0.04}N$ |
| I-3 | AlTiCrSi | AlTiCr | 75 | $Si_{0.02}Ti_{0.42}Al_{0.51}Cr_{0.05}N$ | $Si_{0.04}Ti_{0.4}Al_{0.52}Cr_{0.04}N$ |
| I-4 | AlTiSiNb | AlTiNb | 150 | $Si_{0.16}Ti_{0.3}Al_{0.5}Nb_{0.04}N$ | $Si_{0.18}Ti_{0.25}Al_{0.52}Nb_{0.05}N$ |
| I-5 | AlSiTiW | AlTiWSi | 75 | $Si_{0.26}Ti_{0.2}Al_{0.51}W_{0.03}N$ | $Si_{0.28}Ti_{0.17}Al_{0.53}W_{0.02}N$ |
| I-6 | AlTiWSiY | AlTiWY | 100 | $Si_{0.06}W_{0.24}Ti_{0.24}Al_{0.45}Y_{0.01}N$ | $Si_{0.08}W_{0.26}Ti_{0.18}Al_{0.47}Y_{0.01}N$ |
| I-7 | TiNbSi | TiNb | 150 | $Si_{0.52}Ti_{0.38}Nb_{0.1}(C_{0.2}N_{0.8})$ | $Si_{0.55}Ti_{0.32}Nb_{0.13}(C_{0.2}N_{0.8})$ |
| I-8 | AlTiSiNb | AlTiSiNb | 75 | $Si_{0.04}Ti_{0.31}Al_{0.61}Nb_{0.04}N$ | $Si_{0.04}Ti_{0.31}Al_{0.61}Nb_{0.04}N$ |
| I-9 | AlTiSiCr | AlTiCr | 100 | $Si_{0.18}Ti_{0.3}Al_{0.38}Cr_{0.14}N$ | $Si_{0.18}Ti_{0.3}Al_{0.38}Cr_{0.14}N$ |

TABLE 2

| Sample No. | Composition of coating layer | | Number of droplet | | | |
|---|---|---|---|---|---|---|
| | Fourth region | Third region | First end side | Second end side | Second region | First region |
| I-1 | $Si_{0.02}Ti_{0.28}Al_{0.58}Nb_{0.12}N$ | $Si_{0.01}Ti_{0.2}Al_{0.62}Nb_{0.17}N$ | 30 | 40 | 34.5 | 25 |
| I-2 | $Si_{0.07}Ti_{0.27}Al_{0.62}Nb_{0.04}N$ | $Si_{0.07}Ti_{0.26}Al_{0.83}Nb_{0.04}N$ | 27.8 | 35 | 31.2 | 23 |
| I-3 | $Si_{0.03}Ti_{0.41}Al_{0.52}Cr_{0.04}N$ | $Si_{0.04}Ti_{0.41}Al_{0.5}Cr_{0.05}N$ | 43.4 | 50 | 48.4 | 37 |

TABLE 2-continued

| Sample | Composition of coating layer | | Number of droplet | | | |
|---|---|---|---|---|---|---|
| | | | First | Second | Second | First |
| No. | Fourth region | Third region | end side | end side | region | region |
| I-4 | $Si_{0.17}Ti_{0.27}Al_{0.51}Nb_{0.05}N$ | $Si_{0.16}Ti_{0.23}Al_{0.85}Nb_{0.05}N$ | 25.5 | 30.5 | 28.6 | 24 |
| I-5 | $Si_{0.27}Ti_{0.18}Al_{0.53}W_{0.02}N$ | $Si_{0.25}Ti_{0.23}Al_{0.5}W_{0.02}N$ | 24.6 | 29.7 | 26.6 | 22.4 |
| I-6 | $Si_{0.07}W_{0.25}Ti_{0.21}Al_{0.45}Y_{0.01}N$ | $Si_{0.05}W_{0.25}Ti_{0.24}Al_{0.44}Y_{0.02}N$ | 17.2 | 22 | 19.9 | 15.3 |
| I-7 | $Si_{0.53}Ti_{0.35}Nb_{0.11}(C_{0.2}N_{0.8})$ | $Si_{0.52}Ti_{0.38}Nb_{0.1}(C_{0.2}N_{0.8})$ | 42.4 | 42.4 | 42.4 | 42.4 |
| I-8 | $Si_{0.04}Ti_{0.31}Al_{0.61}Nb_{0.04}N$ | $Si_{0.04}Ti_{0.29}Al_{0.62}Nb_{0.05}N$ | 26.9 | 26.9 | 26.9 | 26.9 |
| I-9 | $Si_{0.10}Ti_{0.3}Al_{0.38}Cr_{0.14}N$ | $Si_{0.19}Ti_{0.27}Al_{0.41}Cr_{0.13}N$ | 44.3 | 44.3 | 44.3 | 44.3 |

A cutting test was conducted using each of the obtained end mills under the following cutting conditions. The results were presented in Table 3.
(Cutting Conditions)
Cutting method: side cutting
Workpiece: titanium alloy (Ti-6Al-4V)
Cutting speed (feed): 79 m/min
Feed rate: 0.06 mm/cutting edge
Depth of Cut: 20 mm in depth, 1 mm in width, and ϕ 10 mm in machining diameter
Cutting state: wet
Evaluation method: Firstly, a cutting process was carried out 20 m, and an amount of tilt of a machined surface of the workpiece was measured by a dial gauge. Thereafter, the cutting process was resumed to evaluate a cutting length at which the end mill reached the end of life. A cutting edge state of the end mill that reached the end of life was observed. The term "the amount of tilt" denotes a shift width in a direction vertical to a bottom surface of the workpiece with respect to an upper end and a lower end of a wall surface of the workpiece.

TABLE 3

| | Cutting performace | | |
|---|---|---|---|
| Sample No. | Machining length (m) | Amount of tilt (μm) | Condition of cutting edge |
| I-1 | 74 | 15 | constant wear |
| I-2 | 72 | 16 | constant wear |
| I-3 | 68 | 18 | constant wear |
| I-4 | 63 | 19 | constant wear |
| I-5 | 57 | 20 | Little chippings |
| I-6 | 50 | 22 | Little chippings |
| I-7 | 47 | 24 | Little chippings |
| I-8 | 30 | 30 | Fracuture |
| I-9 | 40 | 29 | Increased chippings |

From the results presented in Tables 1 to 3, each of Samples Nos. I-1 to I-7, in which a content ratio of Si contained in a part of the first layer which was located at a side of the first end was lower than a content ratio of Si contained in a part of the first layer which was located at a side of the second end, caused less chipping at the cutting edge and achieved cutting performance having a small amount of tilt of a machined surface and having high machining accuracy.

Example 2

An end mill was manufactured in the same manner as EXAMPLE 1, except that a coating layer was obtained by laminating two layers in Sample No. 1 of EXAMPLE 1. One of the two layers was a layer being 1 μm as a lower layer of the coating layer whose composition at a side of a first end was $Si_{0.01}Ti_{0.53}Al_{0.43}W_{0.01}Nb_{0.02}N$, and the other was a layer being 1 μm as an upper layer whose composition on an end flank surface was $Si_{0.01}Ti_{0.33}Al_{0.56}Nb_{0.1}N$.

An overall composition of the coating layer was as follows. A composition at the side of the first end was $Si_{0.01}Ti_{0.43}Al_{0.49}W_{0.01}Nb_{0.06}N$, a composition at a side of a second end was $Si_{0.03}Ti_{0.4}Al_{0.56}W_{0.01}Nb_{0.1}N$, a composition in a second region was $Si_{0.02}Ti_{0.36}Al_{0.53}W_{0.01}Nb_{0.08}N$, and a composition in a first region was $Si_{0.01}Ti_{0.32}Al_{0.55}W_{0.01}Nb_{0.11}N$.

A cutting evaluation was conducted in the same manner as EXAMPLE 1. As a result, a machining length was 80 m, an amount of tilt was 25 μm, and a constant wear was observed at a cutting edge when the process was terminated.

Example 3

A base member made into the shape of the end mill as illustrated in FIGS. 4 and 5 was used as in the case of EXAMPLE 1. The base member manufactured in the same manner as EXAMPLE 1 and targets presented in Table 4 were individually set to a chamber. Here, the base member was set to the chamber so that a first end was directed upward and a second end was directed downward as in the case of EXAMPLE 1. Each of coating layers respectively having compositions presented in Tables 5 and 6 was deposited by setting a deposition temperature to 540° C., by respectively applying vias voltages presented in Table 4, and by passing an arc current 150 A.

Similarly to EXAMPLE 1, characteristics of the end mills in obtained samples were analyzed. The results were presented in Tables 5 and 6. A thickness of each of the coating layers in a fourth region was measured as 2 μm.

TABLE 4

| Sample No. | First target | Second target | Bias voltage (V) | First region | Second region |
|---|---|---|---|---|---|
| II-1 | AlTiNbSi | AlTiNb | 75 | $Si_{0.03}Ti_{0.22}Al_{0.6}Nb_{0.15}N$ | $Si_{0.01}Ti_{0.33}Al_{0.56}Nb_{0.1}N$ |
| II-2 | TiAlSiNb | TiAlNb | 75 | $Si_{0.08}Ti_{0.25}Al_{0.63}Nb_{0.04}N$ | $Si_{0.06}Ti_{0.29}Al_{0.61}Nb_{0.04}N$ |
| II-3 | AlTiCrSi | AlTiCr | 75 | $Si_{0.04}Ti_{0.4}Al_{0.52}Cr_{0.04}N$ | $Si_{0.02}Ti_{0.42}Al_{0.51}Cr_{0.05}N$ |
| II-4 | AlTiSiNb | AlTiNb | 150 | $Si_{0.18}Ti_{0.25}Al_{0.52}Nb_{0.05}N$ | $Si_{0.16}Ti_{0.3}Al_{0.5}Nb_{0.04}N$ |
| II-5 | AlSiTiW | AlTiWSi | 75 | $Si_{0.28}Ti_{0.17}Al_{0.53}W_{0.02}N$ | $Si_{0.26}Ti_{0.2}Al_{0.51}W_{0.03}N$ |

TABLE 4-continued

| Sample No. | First target | Second target | Bias voltage (V) | First region | Second region |
|---|---|---|---|---|---|
| II-6 | AlTiWSiY | AlTiWY | 100 | $Si_{0.08}W_{0.26}Ti_{0.18}Al_{0.47}Y_{0.01}N$ | $Si_{0.06}W_{0.24}Ti_{0.24}Al_{0.45}Y_{0.01}N$ |
| II-7 | TiNbSi | TiNb | 150 | $Si_{0.55}Ti_{0.32}Nb_{0.13}(C_{0.2}N_{0.8})$ | $Si_{0.52}Ti_{0.38}Nb_{0.1}(C_{0.2}N_{0.8})$ |
| II-8 | AlTiSiNb | AlTiSiNb | 75 | $Si_{0.04}Ti_{0.31}Al_{0.61}Nb_{0.04}N$ | $Si_{0.04}Ti_{0.31}Al_{0.61}Nb_{0.04}N$ |
| II-9 | AlTiSiCr | AlTiCr | 100 | $Si_{0.18}Ti_{0.3}Al_{0.38}Cr_{0.14}N$ | $Si_{0.18}Ti_{0.3}Al_{0.38}Cr_{0.14}N$ |

TABLE 5

| Sample No | Composition of coating layer | | Number of droplet | | | |
|---|---|---|---|---|---|---|
| | Fourth region | Third region | First end side | Second end side | Second region | First region |
| II-1 | $Si_{0.02}Ti_{0.28}Al_{0.58}Nb_{0.12}N$ | $Si_{0.01}Ti_{0.2}Al_{0.62}Nb_{0.17}N$ | 42.5 | 31.4 | 46.4 | 28.5 |
| II-2 | $Si_{0.07}Ti_{0.27}Al_{0.62}Nb_{0.04}N$ | $Si_{0.07}Ti_{0.28}Al_{0.63}Nb_{0.04}N$ | 39.4 | 25.7 | 41.5 | 24.5 |
| II-3 | $Si_{0.03}Ti_{0.41}Al_{0.52}Cr_{0.04}N$ | $Si_{0.04}Ti_{0.41}Al_{0.5}Cr_{0.05}N$ | 46.4 | 30.7 | 52.1 | 41.5 |
| II-4 | $Si_{0.17}Ti_{0.27}Al_{0.51}Nb_{0.05}N$ | $Si_{0.16}Ti_{0.23}Al_{0.55}Nb_{0.06}N$ | 26.8 | 21.5 | 29.9 | 25.6 |
| II-5 | $Si_{0.27}Ti_{0.18}Al_{0.53}W_{0.02}N$ | $Si_{0.25}Ti_{0.23}Al_{0.5}W_{0.02}N$ | 35.2 | 24.5 | 38.5 | 31.5 |
| II-6 | $Si_{0.07}W_{0.25}Ti_{0.21}Al_{0.40}Y_{0.01}N$ | $Si_{0.05}W_{0.25}Ti_{0.24}Al_{0.44}Y_{0.02}N$ | 19.6 | 16.8 | 24.2 | 18.5 |
| II-7 | $Si_{0.53}Ti_{0.36}Nb_{0.11}(C_{0.2}N_{0.8})$ | $Si_{0.52}Ti_{0.38}Nb_{0.1}(C_{0.2}N_{0.8})$ | 36.6 | 36.6 | 36.6 | 36.6 |
| II-8 | $Si_{0.04}Ti_{0.31}Al_{0.61}Nb_{0.04}N$ | $Si_{0.04}Ti_{0.29}Al_{0.62}Nb_{0.05}N$ | 26.9 | 26.9 | 26.9 | 26.9 |
| II-9 | $Si_{0.18}Ti_{0.3}Al_{0.38}Cr_{0.14}N$ | $Si_{0.19}Ti_{0.23}Al_{0.41}Cr_{0.13}N$ | 44.3 | 44.3 | 44.3 | 44.3 |

A cutting test was conducted using each of the obtained end mills under the following cutting conditions. The results were presented in Table 6.

(Cutting Conditions)
Cutting method: groove cutting
Workpiece: SCM440
Cutting speed (feed): 78 m/min
Feed rate: 0.035 mm/tooth
Depth of Cut: 15 mm in depth, 10 mm in width, and $\phi$ 10 mm in machining diameter
Cutting state: dry
Evaluation method: An amount of wear at a cutting distance of 50 m was observed. Comparisons were made in terms of cutting distance until the end of tool life, and a cutting edge state of the end mill that reached the end of tool life was observed.

TABLE 6

| | Cutting performance | | |
|---|---|---|---|
| Sample No. | Amount of wear (mm) | Machining length (m) | Condition of cutting edge |
| II-1 | 0.04 | 80 | Constant wear |
| II-2 | 0.05 | 76 | Constant wear |
| II-3 | 0.06 | 73 | Constant wear |
| II-4 | 0.06 | 70 | Constant wear |
| II-5 | 0.08 | 68 | Tiny chippings |
| II-6 | 0.1 | 64 | Increased wear |
| II-7 | 0.11 | 60 | Chippings |
| II-8 | 0.15 | 50 | Increased wear |
| II-9 | 0.13 | 53 | Increased wear |

From the results presented in Tables 4 to 6, each of Samples Nos. II-1 to II-7, in which a content ratio of Si contained in the first region was higher than a content ratio of Si contained in the second region, achieved good cutting performance having excellent wear resistance because wear in the cutting edge developed slow.

DESCRIPTION OF THE REFERENCE NUMERALS 101 rotary tool (drill)
201 rotary tool (end mill)
2 main body
3 cutting edge part
4 shank part
5 tapered part
6 base member
7 coating layer
8 cutting edge
9 chip discharge flute (flute)
10 flank surface
11 first layer
21 end cutting edge
23 outer peripheral cutting edge
25 gash
27 end flank surface
40 AIP apparatus
41 chamber
42 gas inlet
43 cathode electrode
44 anode electrode
45 main target
45a first target
45b second target
46 sample support base
47 tower
48 table
49 heater
50 gas exhaust port
51 bias power source

What is claimed is:
1. A rotary tool, comprising:
a main body having a bar-shape extending from a first end to a second end, wherein the main body comprises a cutting edge part at a side of the first end and a shank part at a side of the second end, the cutting edge part comprises a base member comprising a plurality of ridges, and a coating layer located on at least the ridges, the coating layer comprises a layer comprising $Si_xM_{1-x}(C_{1-y}N_y)$ (where M is selected from the group consisting of: Ti, Al, Cr, W, Mo, Ta, Hf, Nb, Zr, Y, and combinations thereof, $0.01 \leq x \leq 0.55$, and $0 \leq y \leq 1$), wherein when a region close to the first end is referred to as a first region and a region further away from the first end than the first region is referred to as a second region in the coating layer, a content ratio of Si contained in the first region is lower than a content ratio of Si contained in the second region, droplets exist on a surface of the first region and a surface of the second region, and an abundance ratio of the droplets in the first region is lower than an abundance ratio of the droplets in the second region, and the droplets in the second region have a greater size than the droplets in the first region.

2. The rotary tool according to claim 1, wherein
the coating layer contains Ti, and
a content ratio of Ti contained in the first region is higher than a content ratio of Ti contained in the second region.

3. The rotary tool according to claim 1, wherein
the coating layer comprises Al, and
a content ratio of Al in the first region is higher than a content ratio of Al in the second region.

4. The rotary tool according to claim 1, wherein
the coating layer comprises Nb, and
a content ratio of Nb in the first region is lower than a content ratio of Nb in the second region.

5. The rotary tool according to claim 1, wherein
a content ratio of the M in the droplets is higher than a content ratio of the M in the coating layer.

6. The rotary tool according to claim 1, wherein
the cutting edge part further comprises a chip discharge flute which extends from a side of the first end toward a side of the second end in between the ridges, and is located on the coating layer, and when the coating layer located at the chip discharge flute is referred to as a third region and the coating layer located at an outer peripheral surface in the cutting edge part is referred to as a fourth region, a content ratio of Si in at least a part of the third region is lower than a content ratio of Si contained in the fourth region.

7. The rotary tool according to claim 6, wherein
the coating layer comprises Ti, and
a content ratio of Ti in at least a part of the third region is higher than a content ratio of Ti in the fourth region.

8. The rotary tool according to claim 6, wherein
the coating layer comprises Al, and
a content ratio of Al in at least a part of the third region is higher than a content ratio of Al in the fourth region.

* * * * *

UNITED STATES PATENT AND TRADEMARK OFFICE
CERTIFICATE OF CORRECTION

PATENT NO. : 10,953,472 B2
APPLICATION NO. : 16/088848
DATED : March 23, 2021
INVENTOR(S) : Masahiro Waki and Masahiko Kuroda It is certified that error appears in the above-identified patent and that said Letters Patent is hereby corrected as shown below:

On the Title Page

Item (72), change Inventor's residency from 'Satsumasendai' to --Satsumasendai-shi, Kagoshima--

Item (72), change Inventor's residency from 'Higasiomi' to --Higashiomi-shi, Shiga--

In the Specification

Column 9-10, TABLE 2, Column Third region, Row I-2, change '$Si_{0.07}Ti_{0.26}Al_{0.83}Nb_{0.04}N$' to --$Si_{0.07}Ti_{0.26}Al_{0.63}Nb_{0.04}N$--

Column 11-12, TABLE 2-continued, Column Third region, Row I-4, change '$Si_{0.16}Ti_{0.23}Al_{0.85}Nb_{0.05}N$' to --$Si_{0.16}Ti_{0.23}Al_{0.55}Nb_{0.06}N$--

Column 11-12, TABLE 2-continued, Column Fourth region, Row I-6, change '$Si_{0.07}W_{0.25}Ti_{0.21}Al_{0.45}Y_{0.01}N$' to --$Si_{0.07}W_{0.25}Ti_{0.21}Al_{0.46}Y_{0.01}N$--

Column 11-12, TABLE 2-continued, Column Fourth region, Row I-7, change '$Si_{0.53}Ti_{0.35}Nb_{0.11}(C_{0.2}N_{0.8})$' to --$Si_{0.53}Ti_{0.36}Nb_{0.11}(C_{0.2}N_{0.8})$--

Column 11-12, TABLE 2-continued, Column Fourth region, Row I-9, change '$Si_{0.10}Ti_{0.3}Al_{0.38}Cr_{0.14}N$' to --$Si_{0.18}Ti_{0.3}Al_{0.38}Cr_{0.14}N$--

Column 13-14, TABLE 5, Column Third region, Row II-2, change '$Si_{0.07}Ti_{0.28}Al_{0.63}Nb_{0.04}N$' to --$Si_{0.07}Ti_{0.26}Al_{0.63}Nb_{0.04}N$--

Column 13-14, TABLE 5, Column Fourth region, Row II-6, change '$Si_{0.07}W_{0.25}Ti_{0.21}Al_{0.40}Y_{0.01}N$' to --$Si_{0.07}W_{0.25}Ti_{0.21}Al_{0.46}Y_{0.01}N$--

Signed and Sealed this
Thirteenth Day of July, 2021

Drew Hirshfeld
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 10,953,472 B2

Column 13-14, TABLE 5, Column Third region, Row II-9, change '$Si_{0.19}Ti_{0.23}Al_{0.41}Cr_{0.13}N$' to --$Si_{0.19}Ti_{0.27}Al_{0.41}Cr_{0.13}N$--